(12) United States Patent
Imada et al.

(10) Patent No.: US 8,198,653 B2
(45) Date of Patent: Jun. 12, 2012

(54) COMPOUND SEMICONDUCTOR DEVICE AND MANUFACTURING METHOD OF THE SAME

(75) Inventors: Tadahiro Imada, Kawasaki (JP); Atsushi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 21 days.

(21) Appl. No.: 12/618,384

(22) Filed: Nov. 13, 2009

(65) Prior Publication Data

US 2010/0163928 A1 Jul. 1, 2010

(30) Foreign Application Priority Data

Dec. 26, 2008 (JP) ................................. 2008-334793

(51) Int. Cl.
*H01L 29/778* (2006.01)
*H01L 21/335* (2006.01)

(52) U.S. Cl. ......... 257/194; 257/E29.246; 257/E21.403; 438/172

(58) Field of Classification Search .................. 257/194, 257/E29.246, E21.403; 438/172
See application file for complete search history.

(56) References Cited

U.S. PATENT DOCUMENTS

| | | | |
|---|---|---|---|
| 7,132,699 B2 | 11/2006 | Kimura et al. | |
| 7,465,997 B2 | 12/2008 | Kinzer et al. | |
| 7,884,395 B2* | 2/2011 | Saito | 257/199 |
| 7,898,004 B2* | 3/2011 | Wu et al. | 257/194 |
| 2005/0189561 A1* | 9/2005 | Kinzer et al. | 257/192 |
| 2005/0258450 A1 | 11/2005 | Saxler | |
| 2007/0102727 A1 | 5/2007 | Twynam | |
| 2007/0158692 A1 | 7/2007 | Nakayama | |
| 2008/0128862 A1 | 6/2008 | Sugimoto | |
| 2008/0179694 A1 | 7/2008 | Nakazawa et al. | |
| 2009/0146185 A1* | 6/2009 | Suh et al. | 257/194 |
| 2010/0090251 A1* | 4/2010 | Lorenz et al. | 257/194 |
| 2010/0097105 A1 | 4/2010 | Morita et al. | |
| 2010/0155781 A1* | 6/2010 | Suzuki et al. | 257/195 |
| 2010/0167478 A1* | 7/2010 | Nakazawa et al. | 438/191 |

FOREIGN PATENT DOCUMENTS

| | | |
|---|---|---|
| JP | 2006-140368 | 6/2006 |
| WO | WO-2006/001369 | 1/2006 |
| WO | WO-2008/062800 A1 | 5/2008 |

OTHER PUBLICATIONS

Chinese Office Action mailed by Chinese Patent Office and corresponding to Chinese application No. 200910205387.3 on May 6, 2011, with English translation.
Kanechika, Masakazu et al., "A Vertical Insulated Gate AlGaN/GaN Heterojunction Field-Effect Transistor", JJAP Express Letter—Japanese Journal of Applied Physics, May 25, 2007, pp. L503-L505, vol. 46, No. 21, The Japan Society of Applied Physics, Japan.
European Search Report mailed Feb. 6, 2012 for corresponding European Application No. EP 09171693.

* cited by examiner

*Primary Examiner* — Victor A Mandala
(74) *Attorney, Agent, or Firm* — Fujitsu Patent Center

(57) ABSTRACT

An i-GaN layer (electron transit layer), an n-GaN layer (compound semiconductor layer) formed over the i-GaN layer (electron transit layer), and a source electrode, a drain electrode and a gate electrode formed over the n-GaN layer (compound semiconductor layer) are provided. A recess portion is formed inside an area between the source electrode and the drain electrode of the n-GaN layer (compound semiconductor layer) and at a portion separating from the gate electrode.

9 Claims, 17 Drawing Sheets

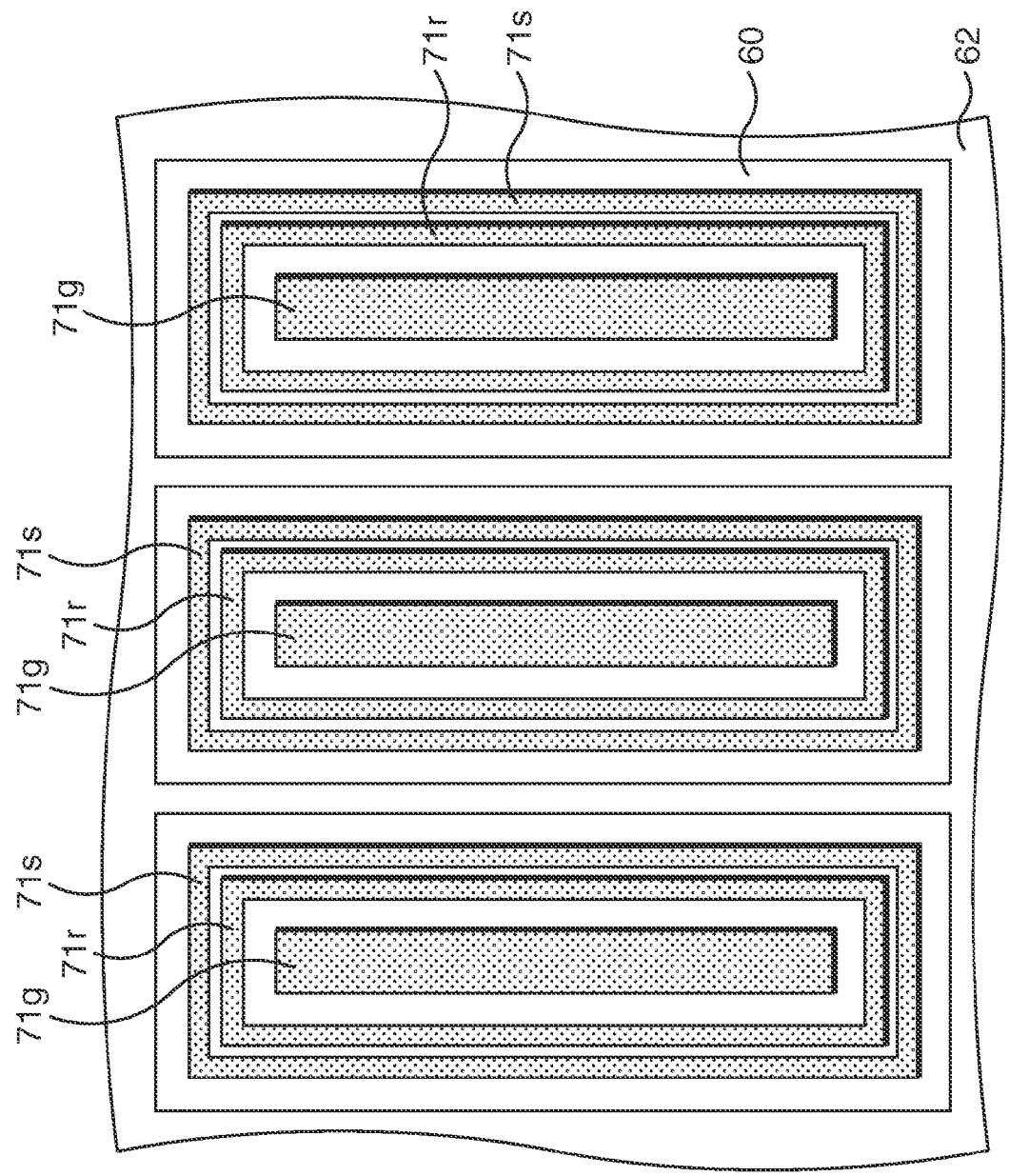

COMPOUND SEMICONDUCTOR DEVICE AND MANUFACTURING METHOD OF THE SAME

CROSS-REFERENCE TO RELATED APPLICATIONS

This application is based upon and claims the benefit of priority of the prior Japanese Patent Application No. 2008-334793, filed on Dec. 26, 2008, the entire contents of which are incorporated herein by reference.

FIELD

The embodiments discussed herein are directed to a compound semiconductor device and a manufacturing method thereof.

BACKGROUND

Conventionally, a study relating to a high electron mobility transistor (HEMT) in which an AlGaN layer and a GaN layer are formed over a substrate by crystal growth, and the GaN layer functions as an electron transit layer has been performed. A band gap of GaN is 3.4 eV, and it is larger than a band gap of GaAs (1.4 eV). Accordingly, a withstand voltage of a GaN based HEMT is high, and it is expectable as a high withstand voltage electronic device for automobiles and so on.

Besides, there are a horizontal structure, in which a source and a drain are disposed in parallel to a surface of a substrate, and a vertical structure, in which a source and a drain are disposed perpendicularly to a surface of a substrate, as structures of the GaN based HEMT.

In the GaN based HEMT, a current flows in a channel because two-dimensional electron gas (2DEG) resulting from a difference between lattice constants exists at the channel positioning in a vicinity of a gate electrode, caused by a structure of the GaN based HEMT even in a case when a voltage is not applied to the gate electrode. Namely, a normally-on operation is performed. On the other hand, it is also conceivable that current flows between the source and the drain when "0" (zero) V is unintentionally applied to the gate electrode, when a power is turned on, when the gate electrode is broken, or the like. Accordingly, a normally-off operation of the GaN based HEMT is desired from a point of view of fail-safe.

It is known that the normally-off operation is enabled by a structure in which a recess is formed at a compound semiconductor layer positioning directly below the gate electrode (gate recess structure) as for the GaN based HEMT having the horizontal structure.

However, in the gate recess structure as stated above, the normally-off operation is enabled, but a threshold voltage is 1 V or less, and a leak current may be generated even though the gate voltage is "0" (zero) V. Besides, it is difficult to use it for an electronic device to which a high voltage is applied if the threshold voltage is 1 V or less, because noise increases and operations become unstable when the high voltage is applied. It is possible to increase the threshold voltage by changing a material from the GaN based material, but it may result in a case that a sufficient current cannot be obtained, or it becomes easy to break only by changing the material.

On the other hand, a study has also been performed to enable the normally-off operation in the GaN based HEMT having the vertical structure, but mass production thereof is difficult by either method.

The following are examples of related art of the present invention: Japanese Laid-open Patent Publication No. 2006-140368; International Publication Pamphlet No. WO 2006/001369; and Japanese Journal of Applied Physics vol. 46, No. 21, 2007, pp. L503-L505.

SUMMARY

According to an aspect of the embodiment, a first compound semiconductor device includes: an electron transit layer; a compound semiconductor layer formed over the electron transit layer; and a source electrode, a drain electrode and a gate electrode formed over the compound semiconductor layer. A recess portion is formed inside an area between the source electrode and the drain electrode of the compound semiconductor layer and at a portion separating from the gate electrode.

According to another aspect of the embodiment, a second compound semiconductor device, includes: an electron transit layer; a compound semiconductor layer formed over the electron transit layer; a gate electrode and a source electrode formed over the compound semiconductor layer, and a drain electrode formed below the electron transit layer. A recess portion is formed inside an area between the source electrode and the gate electrode of the compound semiconductor layer.

Additional objects and advantages of the embodiment will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

FIG. 11 is a layout view illustrating the structure of the GaN based HEMT according to the third embodiment;

DESCRIPTION OF EMBODIMENTS

First Embodiment

Figure 1:
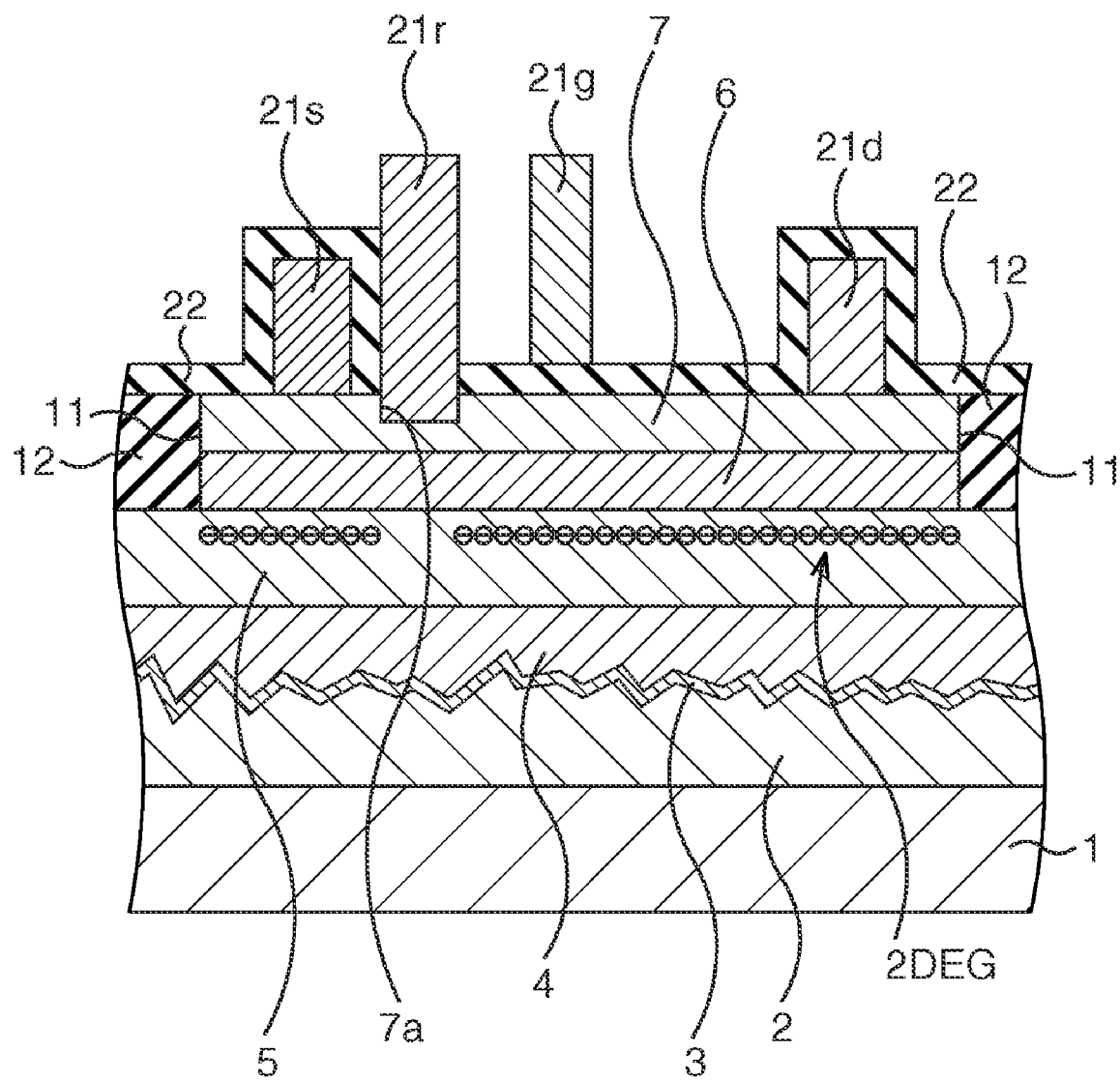
FIG. 1 is a sectional view illustrating a structure of a GaN based HEMT (compound semiconductor device) according to a first embodiment.

First, a first embodiment is described. FIG. 1 is a sectional view illustrating a structure of a GaN based HEMT (compound semiconductor device) according to the first embodiment.

In the first embodiment, an undoped i-AlN layer 2 with a thickness of approximately 1 μm to 100 μm (for example, 25 μm) is formed on a substrate 1 such as an n-type conductive single-crystal SiC substrate. Relatively large concaves and convexes exist at a surface of the i-AlN layer 2. An undoped i-AlN layer 3 of which thickness is 100 nm or less (for example, 20 nm to 50 nm) is formed on the i-AlN layer 2. A GaN layer 4 of which thickness is approximately 0.1 μm to 10 μm (for example, 0.5 μm) is formed on the i-AlN layer 3. Fe, which is a transition metal element, is contained in the GaN layer 4 as an impurity. A content ratio of Fe is, for example, approximately $1\times10^{18}$ cm$^{-3}$ to $1\times10^{20}$ cm$^{-3}$. The thickness of the GaN layer 4 is approximately 0.1 μm to 10 μm, and therefore, a surface of the GaN layer 4 is flat even though the concaves and convexes exist at the surface of the i-AlN layer 2. An undoped i-GaN layer 5 of which thickness is approximately 0.1 μm to 10 μm is formed on the GaN layer 4. Fe is not contained in the i-GaN layer 5. An n-type n-AlGaN layer 6 of which thickness is approximately 5 nm to 50 nm is formed on the i-GaN layer 5. An n-type n-GaN layer 7 of which thickness is approximately 0.1 nm to 10 nm is formed on the n-AlGaN layer 6. For example, Si is contained in the n-AlGaN layer 6 and the n-GaN layer 7 as an impurity with a concentration of approximately $5\times10^{17}$ cm$^{-3}$ to $5\times10^{19}$ cm$^{-3}$.

A trench 11 for element isolation is formed in the n-AlGaN layer 6 and the n-GaN layer 7, and an element isolation insulating film 12 is embedded in the trench 11. A source electrode 21s and a drain electrode 21d are formed on the n-GaN layer 7. The source electrode 21s and the drain electrode 21d may be constituted by, for example, a Ta film and an Al film formed thereon, and the source electrode 21s and the drain electrode 21d form an ohmic junction with the n-GaN layer 7.

Further, an SiN film 22 covering the n-GaN layer 7, the source electrode 21s and the drain electrode 21d is formed, and a gate electrode 21g is formed on the SiN film 22 between the source electrode 21s and the drain electrode 21d. A thickness of the SiN film 22 is approximately 10 nm to 2000 nm. Besides, an opening is formed in the SiN film 22 between the source electrode 21s and the gate electrode 21g, and a recess portion 7a is formed at a portion exposing from this opening of the n-GaN layer 7. The recess portion 7a may either stop at the n-GaN layer 7 or extend up to the n-AlGaN layer 6. A recess electrode 21r extending upward from the recess portion 7a is formed. The gate electrode 21g and the recess electrode 21r may be constituted by, for example, an Ni film and an Au film formed thereon, and the recess electrode 21r forms a schottky junction with the n-GaN layer 7.

Besides, the source electrode 21s and the recess electrode 21r are grounded.

Figure 2:
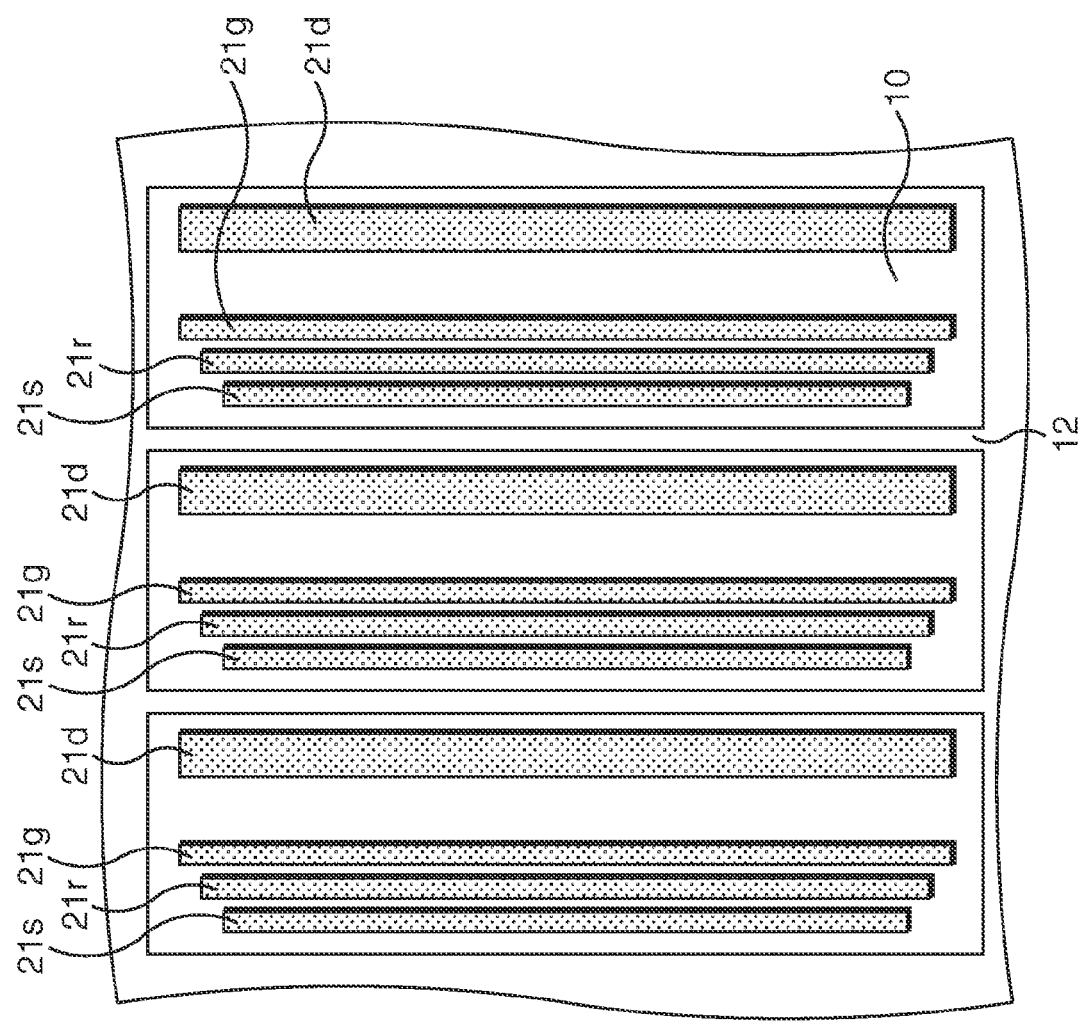
FIG. 2 is a layout view illustrating the structure of the GaN based HEMT according to the first embodiment.

As stated above, a piece of GaN based HEMT is constituted. Further, the GaN based HEMTs as stated above are provided so as to be arranged in one direction via the element isolation insulating film 12 as illustrated in FIG. 2. A region surrounded by the element isolation insulating film 12 is an element region 10. The GaN based HEMTs may be provided so as to be arranged in two directions via the element isolation insulating film 12.

In the first embodiment as stated above, electrons are induced in a vicinity of an interface between the i-GaN layer 5 and the n-AlGaN layer 6 by a piezoelectric effect resulting from a lattice mismatch. As a result, two-dimensional electron gas (2DEG) appears, and this portion functions as an electron transit layer and the n-AlGaN layer 6 functions as an electron supply layer. Besides, the i-AlN layer 2 functions as an insulating layer insulating between the substrate 1 and compound semiconductor layers including the i-GaN layer 5. Incidentally, it is desirable that a thickness of the i-GaN layer 5 is 0.5 μm or more so that the two-dimensional electron gas inside the i-GaN layer 5 is difficult to be affected by Fe added to the GaN layer 4.

The two-dimensional electron gas appears at a surface layer portion of the i-GaN layer 5 as stated above, but in the present embodiment, the recess electrode 21r forming the schottky-junction with the n-GaN layer 7 is provided inside the recess portion 7a, and the recess electrode 21r is grounded. Accordingly, the two-dimensional electron gas does not exist at the surface layer portion of the i-GaN layer 5 at downward of the recess electrode 21r. Consequently, a leak current does not flow between the source electrode 21s and the drain electrode 21d under a state in which the voltage is not applied to the gate electrode 21g and an electric field seldom exists between the gate electrode 21g and the source electrode 21s. Namely, the normally-off operation is enabled. Besides, the current does not flow if the voltage higher than the conventional one is not applied to the gate electrode 21g, because the two-dimensional electron gas does not exist at the surface layer portion of the i-GaN layer 5 at downward of the recess electrode 21r. Namely, a threshold voltage increases.

Figure 3:
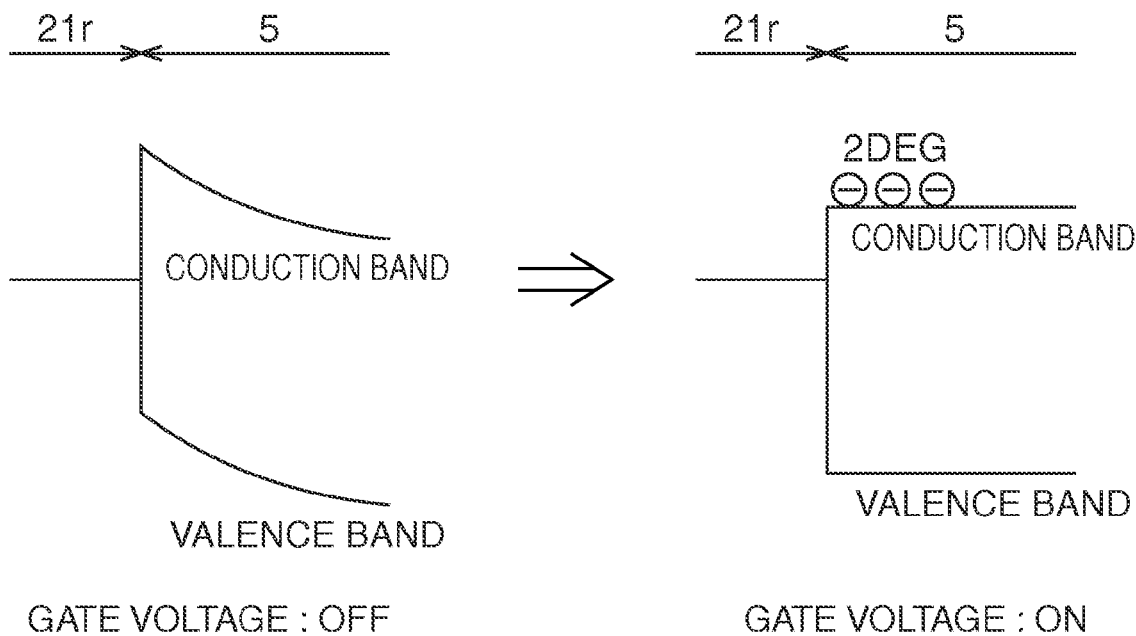
FIG. 3 is a band diagram illustrating an energy structure at downward of a recess electrode $21r$.

FIG. 3 is a band diagram illustrating an energy structure at downward of the recess electrode 21r. As illustrated in FIG. 3, a conduction band at the recess electrode 21r side of the i-GaN layer 5 is pulled up and the two-dimensional electron gas is unable to exist there under a state in which the voltage is not applied to the gate electrode 21g. On the other hand, when a predetermined voltage (for example, 5V) is applied to the gate electrode 21g, the conduction band becomes approximately even and the current flows. The normally-off operation is enabled as stated above.

Figure 4:
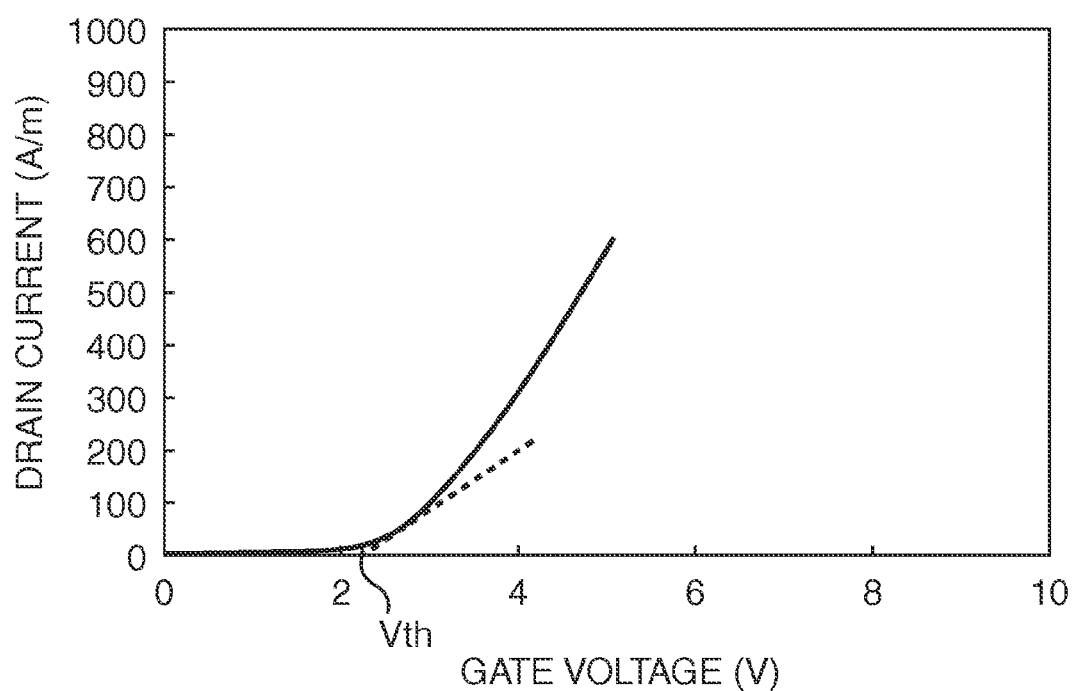
FIG. 4 is a graphic chart illustrating a relation between a drain current and a gate voltage in the first embodiment.

FIG. 4 is a graphic chart illustrating a relation between a drain current and a gate voltage in the first embodiment. This graphic chart represents a simulation result when the source electrode 21s and the recess electrode 21r are grounded and the voltage of +20 V is applied to the drain electrode 21d. As illustrated in FIG. 4, a threshold voltage Vth exceeds 2 V, and the drain current when the voltage applied to the gate electrode 21g (gate voltage) is "0" (zero) V is "0" (zero) A/m.

As stated above, according to the first embodiment, it is possible to obtain the high threshold voltage, and to reduce the leak current when the gate voltage is "0" (zero) V.

Next, a manufacturing method of the GaN based HEMT (compound semiconductor device) according to the first embodiment is described. FIG. 5A to FIG. 5I are sectional views illustrating the manufacturing method of the GaN based HEMT (compound semiconductor device) according to the first embodiment in process sequence.

Figure 5A:
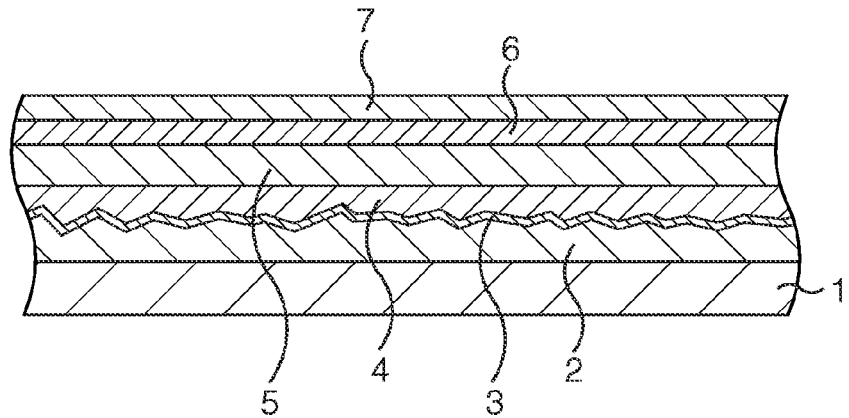
FIG. 5A to FIG. 5I are sectional views illustrating a manufacturing method of the GaN based HEMT according to the first embodiment in process sequence.

In the first embodiment, first, the i-AlN layer 2 is formed on the substrate 1 by, for example, a hydride vapor phase epitaxy (HVPE) method, as illustrated in FIG. 5A. At this time, for example, trimethylaluminum gas, ammonia gas, and HCl gas are used as source gas, a growth pressure is set at an atmospheric pressure, and a growth speed is set at 100 μm/h.

Next, the i-AlN layer 3, the GaN layer 4, the i-GaN layer 5, the n-AlGaN layer 6, and the n-GaN layer 7 are sequentially formed on the i-AlN layer 2 by, for example, a metal organic chemical vapor deposition (MOCVD) method. When these layers are formed, the trimethylaluminum gas is used as a material of Al, trimethylgallium gas is used as a material of Ga, and the ammonia gas is used as a material of N. Besides, a flow rate of the ammonia gas is set at, for example, 100 ccm to 10 μM. Besides, the growth pressure is set at 50 Torr to 300 Torr, a growth temperature is set at 1000° C. to 1200° C. When the GaN layer 4 containing Fe is formed, for example, a metal-organic material containing Fe such as ferrocene is used as a material of Fe. Besides, when the n-AlGaN layer 6 and the n-GaN layer 7 are formed, for example, diluted $SiH_4$ is used as a material of Si. A flow rate of the diluted $SiH_4$ is set at, for example, a several ccm.

Figure 5B:
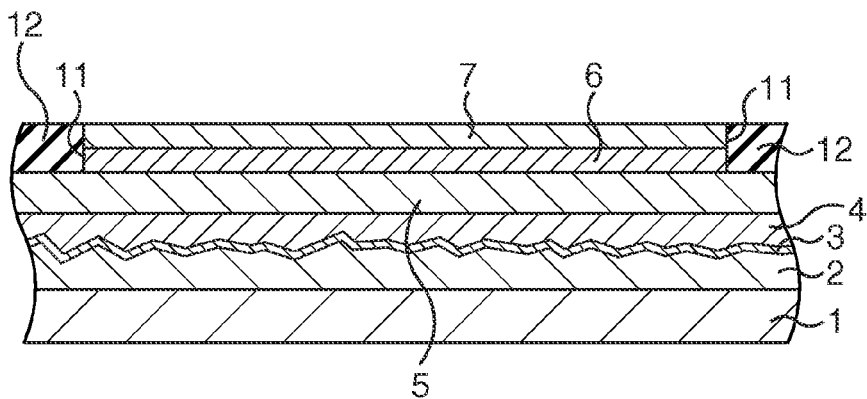

Subsequently, the trench 11 penetrating the n-GaN layer 7 and the n-AlGaN layer 6 and reaching the i-GaN layer 5 is formed by a photolithography and an etching, as illustrated in FIG. 5B. Next, the element isolation insulating film 12 is embedded in the trench 11 by, for example, a plasma CVD method. Incidentally, an element isolation region may be formed by an ion implantation of Ar or the like, instead of the formation of the trench 11 and the element isolation insulating film 12.

Figure 5C:
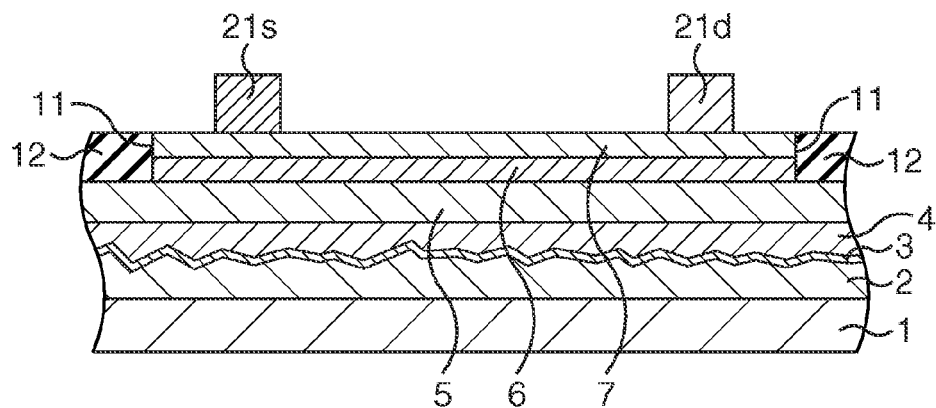

The source electrode 21s and the drain electrode 21d are then formed on the n-GaN layer 7 by a lift-off method, as illustrated in FIG. 5C. A new resist pattern opening areas to form the source electrode 21s and the drain electrode 21d is formed, vapor depositions of Ta and Al are performed, and thereafter, Ta and Al adhered on the resist pattern are removed together with the resist pattern, to form the source electrode 21s and the drain electrode 21d. Thicknesses of a Ta film, an Al film are, for example, respectively approximately 20 nm, 200 nm. A heat treatment is performed from 400° C. to 1000° C., for example, at 600° C. in a nitride atmosphere to establish ohmic characteristics.

Figure 5D:
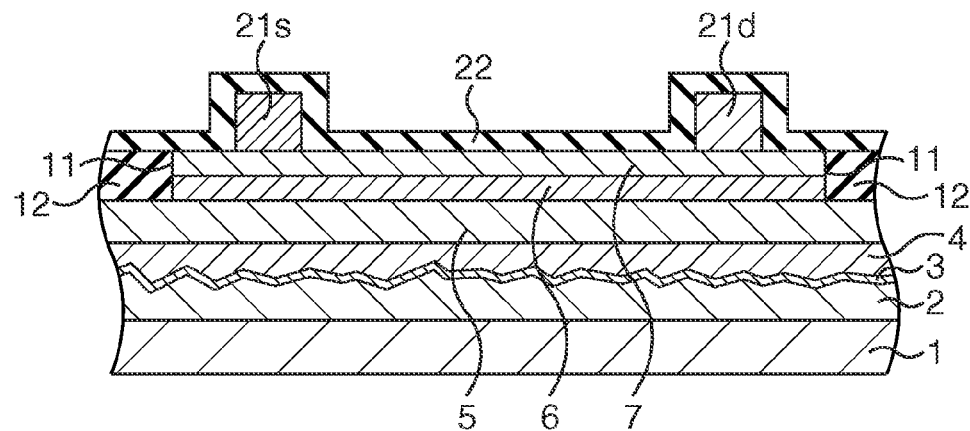

Next, the SiN film 22 is formed on a whole surface by, for example, a plasma CVD method, as illustrated in FIG. 5D.

Figure 5E:
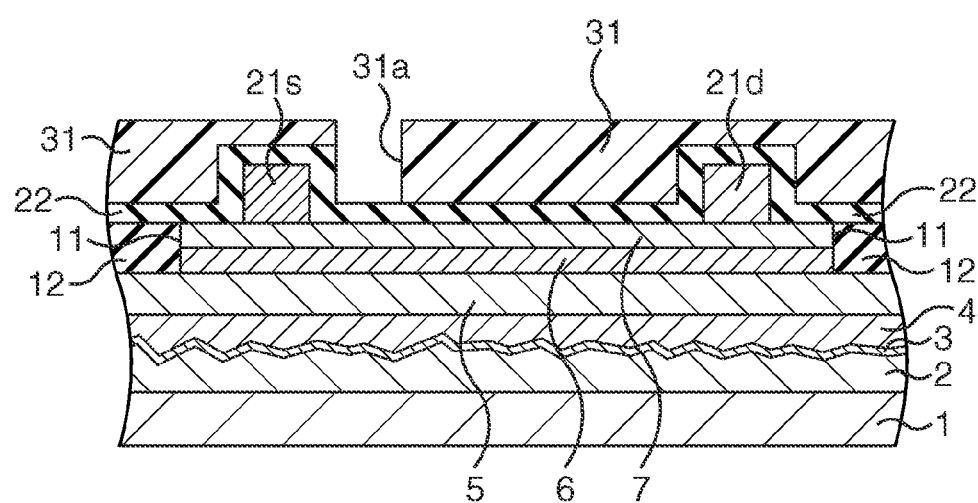

After that, a resist pattern 31 having an opening 31a corresponding to an area to form the recess portion 7a and covering the other area is formed on the SiN film 22, as illustrated in FIG. 5E.

Figure 5F:
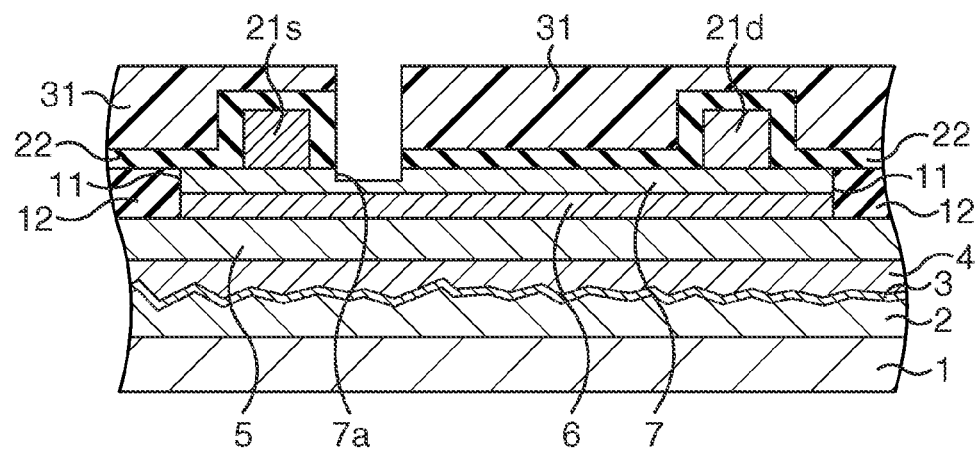

Subsequently, an opening is formed in the SiN film 22 by etching the SiN film 22 while using the resist pattern 31 as a mask, and the recess portion 7a is formed by further etching the surface layer portion of the n-GaN layer 7, as illustrated in FIG. 5F. A remaining thickness of a portion where the recess portion 7a is formed of the n-GaN layer 7 is preferable to be 10 nm or less, and it is set to be, for example, approximately 5 nm to 10 nm. The resist pattern 31 is then removed. Besides, it is preferable that a difference between the thickness (remaining thickness) of the portion where the recess portion 7a is formed of the n-GaN layer 7 and the thickness of the other portion is 5 nm or more. A reason why the remaining thickness is preferable to be set at 10 nm or less is because there may be a case when the appearance of the two-dimensional electron gas cannot be suppressed enough if the remaining thickness exceeds 10 nm. Besides, a reason why the difference of the thicknesses is preferable to be set at 5 nm or more is because there may be a case when an effect of the recess cannot be fully obtained and the normally-off operation becomes difficult when the difference is less than 5 nm.

Figure 5G:
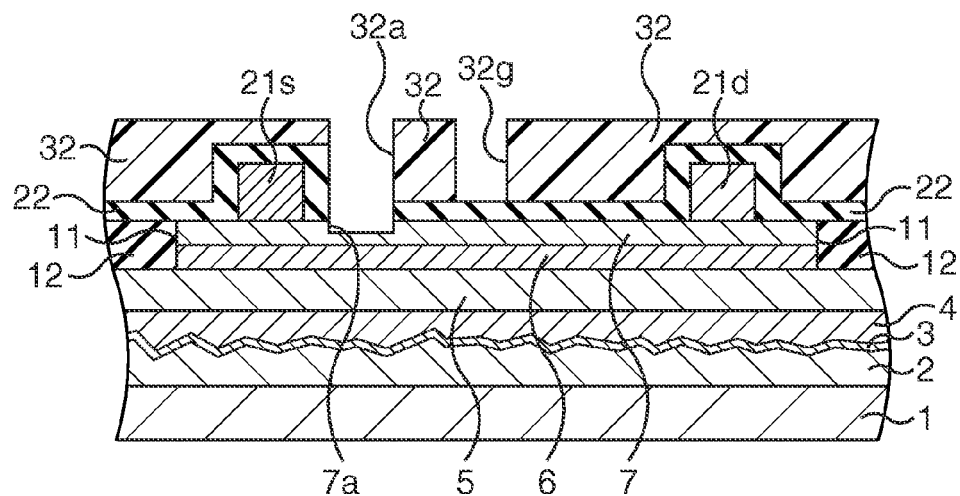

Next, a resist pattern 32 having an opening 32g corresponding to an area to form the gate electrode 21g and an opening 32a exposing the recess portion 7a, and covering the other area is formed on the SiN film 22, as illustrated in FIG. 5G.

Figure 5H:
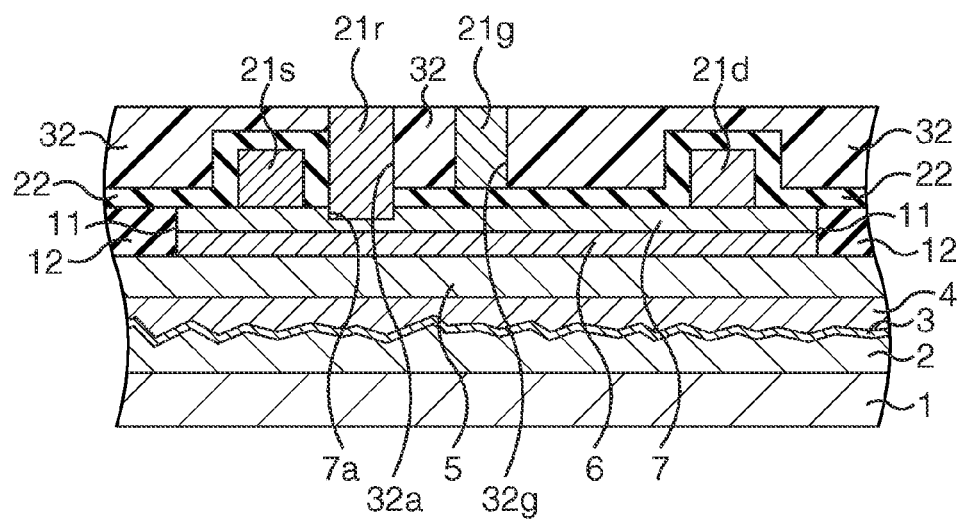

After that, the gate electrode 21g and the recess electrode 21r are formed by performing vapor depositions of Ni and Au, as illustrated in FIG. 5H. Thicknesses of an Ni film and an Au film are, for example, respectively approximately 10 nm and 300 nm.

Figure 5I:
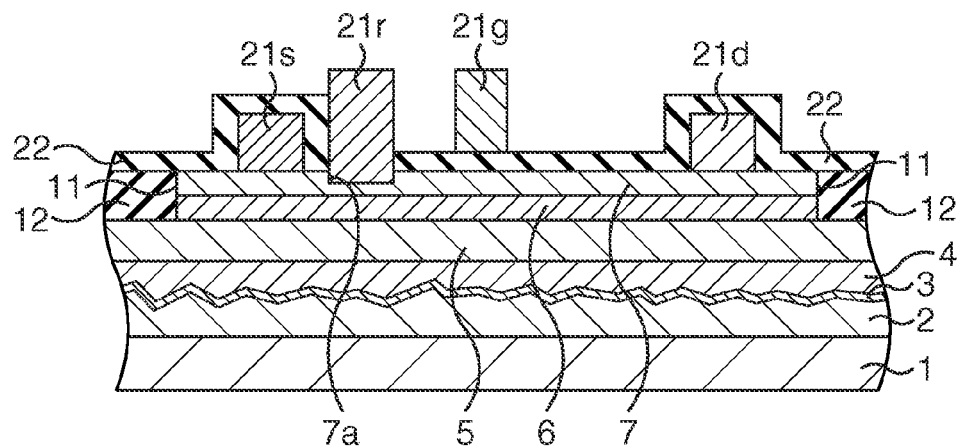

Subsequently, Ni and Au adhered on the resist pattern 32 are removed together with the resist pattern 32, as illustrated in FIG. 5I. Thus, the gate electrode 21g and the recess electrode 21r can be formed by a lift-off method.

Next, a wiring to ground the source electrode 21s and the recess electrode 21r, and so on are formed.

The GaN based HEMT according to the first embodiment is completed as stated above. After that, a semiconductor device in which the GaN based HEMTs are integrated is completed by forming a passivation film, external electrodes, and so on if necessary.

In the first embodiment, the recess electrode 21r and the source electrode 21s are separated from each other, and the SiN film 22 exists therebetween, but the recess electrode 21r and the source electrode 21s may be directly in contact.

Second Embodiment

Figure 6:
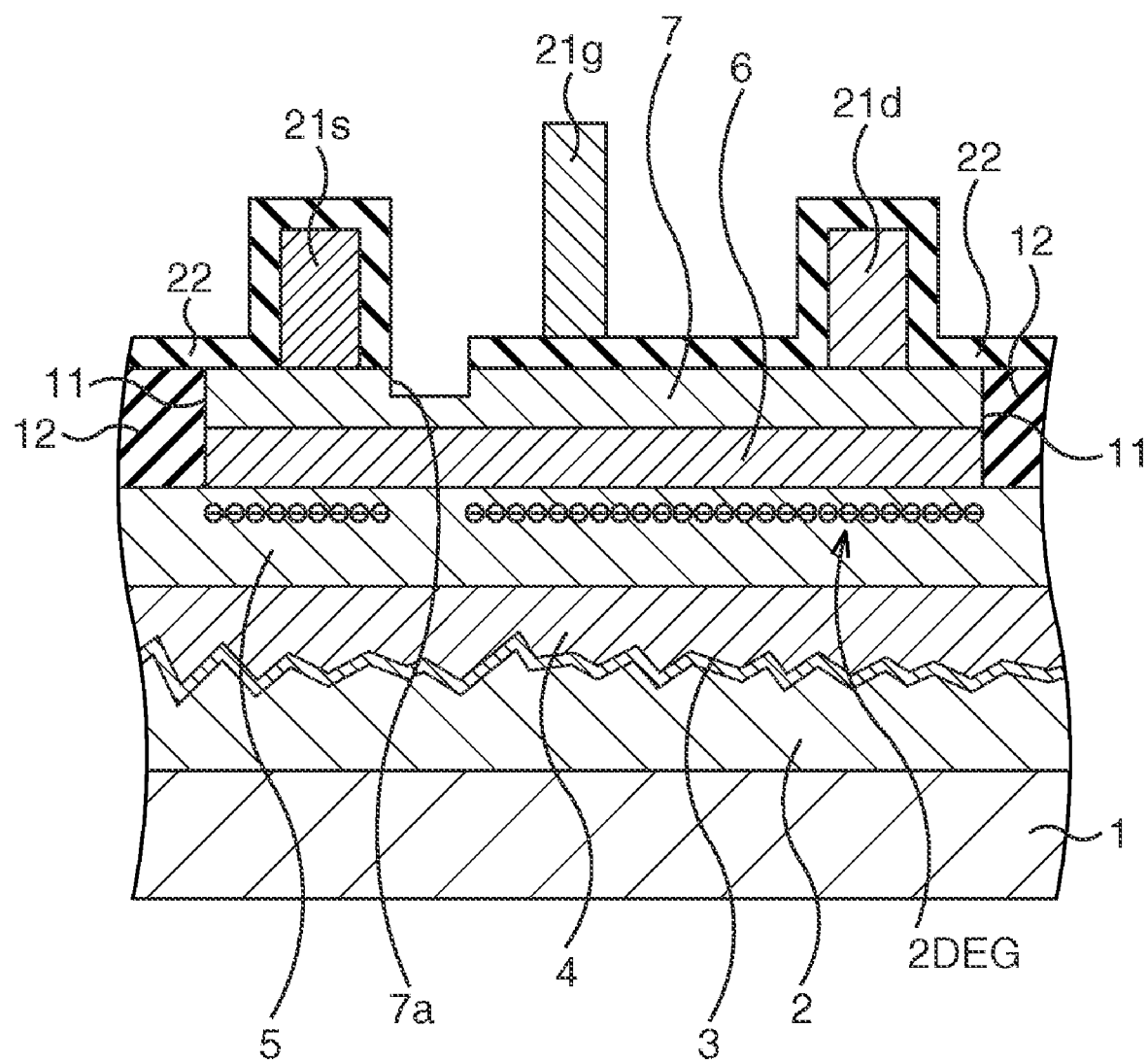
FIG. 6 is a sectional view illustrating a structure of a GaN based HEMT (compound semiconductor device) according to a second embodiment.

Next, a second embodiment is described. FIG. 6 is a sectional view illustrating a structure of a GaN based HEMT (compound semiconductor device) according to the second embodiment.

The recess electrode 21r provided in the first embodiment is not provided in the second embodiment. However, damages capturing electrons exist around the recess portion 7a. The other constitution is the same as the first embodiment.

Figure 7:
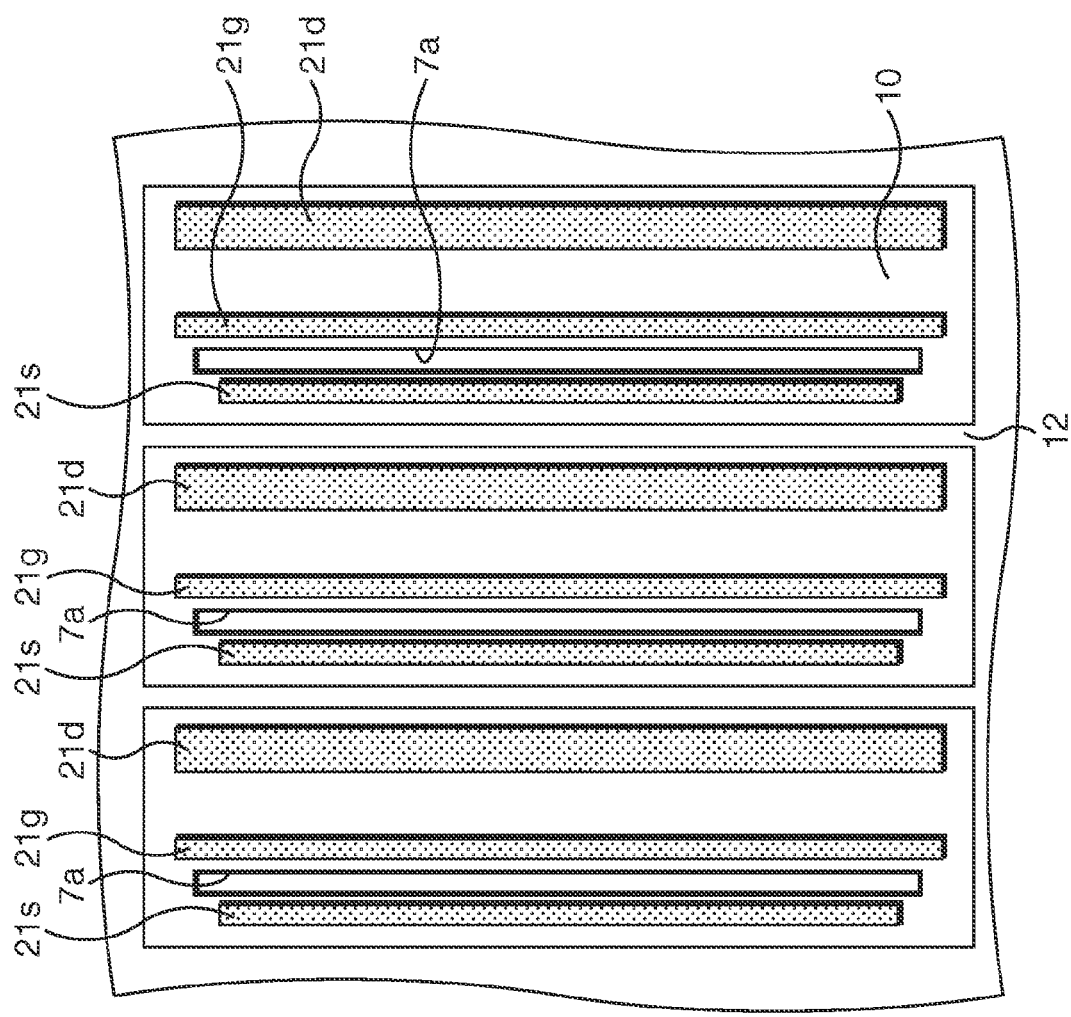
FIG. 7 is a layout view illustrating the structure of the GaN based HEMT according to the second embodiment.

A piece of GaN based HEMT is constituted as stated above. Besides, the GaN based HEMTs are provided so as to be arranged in one direction via the element isolation insulating film 12, as illustrated in FIG. 7. The region surrounded by the element isolation insulating film 12 is the element region 10. The GaN based HEMTs may be provided so as to be arranged in two directions via the element isolation insulating film 12.

The two-dimensional electron gas appears at the surface layer portion of the i-GaN layer 5 in the second embodiment as stated above as same as the first embodiment, and the two-dimensional electron gas does not exist at the surface layer portion of the i-GaN layer 5 at downward of the recess portion 7a. This is because the electrons are captured by the damages around the recess portion 7a, and a balance of electric charges is established.

Figure 8:
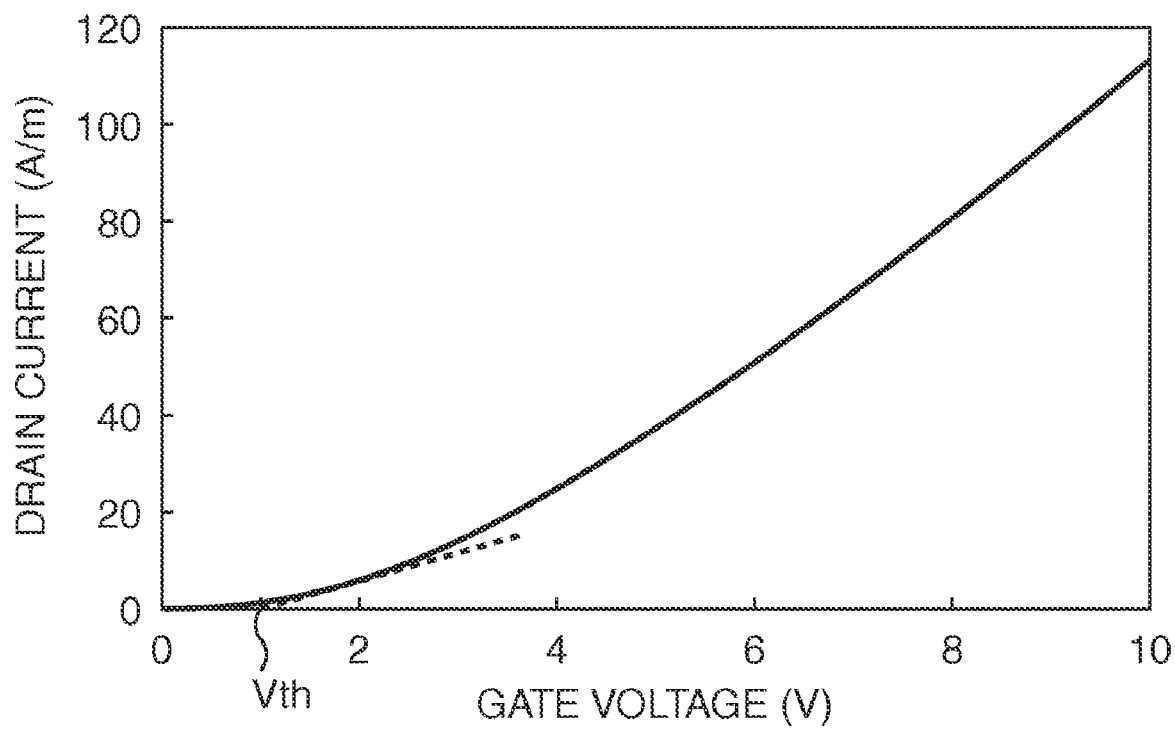
FIG. 8 is a graphic chart illustrating a relation between a drain current and a gate voltage in the second embodiment.

FIG. 8 is a graphic chart illustrating a relation between a drain current and a gate voltage in the second embodiment. This graphic chart represents a simulation result when the source electrode 21s and the recess electrode 21r are grounded, and a voltage of +20 V is applied to the drain electrode 21d. As illustrated in FIG. 8, the threshold voltage Vth is approximately 1 V, but the drain current when the voltage applied to the gate electrode 21g (gate voltage) is "0" (zero) V is "0" (zero) A/m.

As stated above, the leak current when the gate voltage is "0" (zero) V can also be reduced by the second embodiment. Besides, the structure is simple compared to the first embodiment, and therefore, a manufacture thereof is easy, and the cost can be reduced.

Figure 9A:
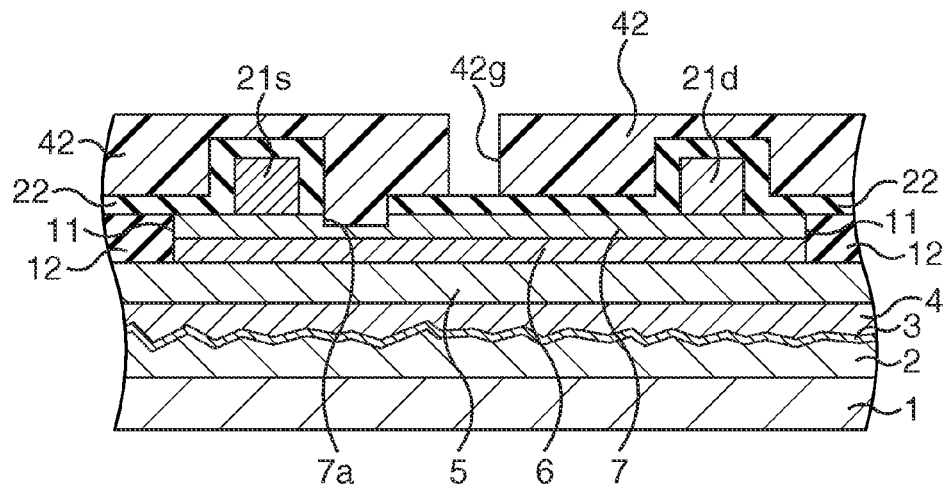
FIG. 9A to FIG. 9C are sectional views illustrating a manufacturing method of the GaN based HEMT according to the second embodiment in process sequence.
Figure 9B:
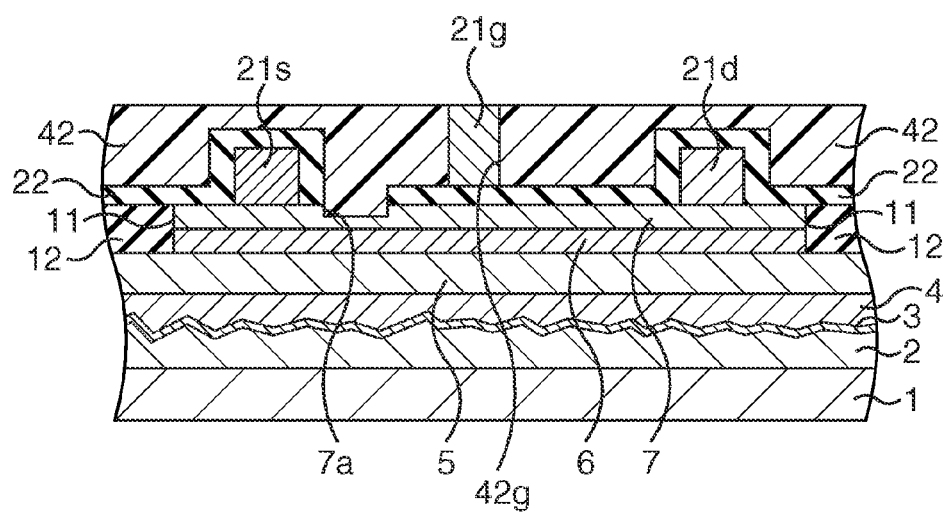
Figure 9C:
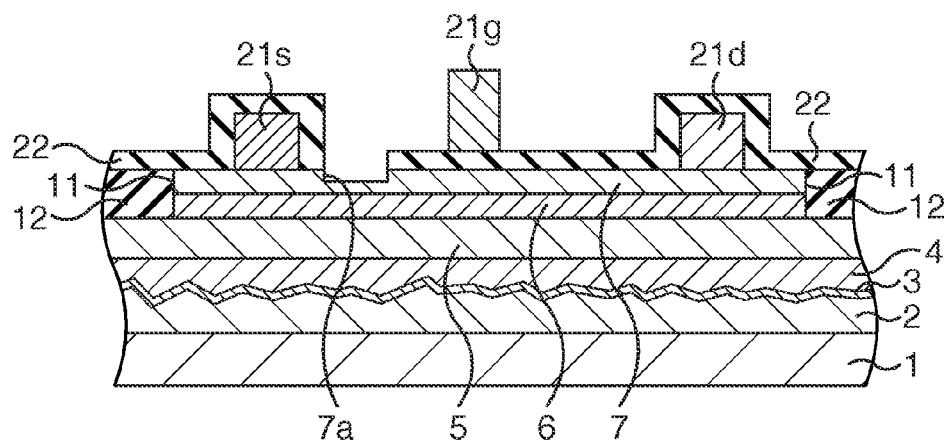

Next, a manufacturing method of the GaN based HEMT (compound semiconductor device) according to the second embodiment is described. FIG. 9A to FIG. 9C are sectional views illustrating the manufacturing method of the GaN based HEMT (compound semiconductor device) according to the second embodiment in process sequence.

In the second embodiment, at first, the processes up to the formation of the recess portion 7a (FIG. 5F) are performed as same as the first embodiment. Incidentally, for example, a dry etching such as a reactive ion etching (RIE) using chlorine gas is performed when the recess portion 7a is formed. Besides, a pressure is set to be approximately 0.1 Pa to 10 Pa (for example, 2 Pa), and a flow rate of the chlorine gas is set to be approximately 0.1 sccm to 10 sccm (for example, 2.5 sccm). The n-GaN layer 7 is processed under the condition as stated above, and thereby, the recess portion 7a in which many traps capturing electrons exist therearound is formed.

Next, the resist pattern 31 used for the formation of the recess portion 7a is removed, and a resist pattern 42 having an opening 42g corresponding to an area to form the gate electrode 21g and covering the other area is formed on the SiN film 22, as illustrated in FIG. 9A.

After that, the gate electrode 21g is formed by performing the vapor deposition of Ni and Au, as illustrated in FIG. 9B. Thicknesses of the Ni film and Au film are, for example, respectively approximately 10 nm and 300 nm.

Subsequently, Ni and Au adhered on the resist pattern 42 are removed together with the resist pattern 42, as illustrated in FIG. 9C. The gate electrode 21g can be formed by the lift-off method as stated above.

The GaN based HEMT according to the second embodiment is completed as stated above.

In the first and second embodiments, the opening for the source electrode and the opening for the drain electrode may be formed only in the n-GaN layer 7, and the source electrode 21s and the drain electrode 21d may be formed in these openings. A part of the n-GaN layer 7 may remain or a part of the n-AlGaN layer 6 may be removed as for depths of these openings. Namely, the depths of the openings are not necessarily match with the thickness of the n-GaN layer 7.

Besides, the gate electrode 21g and the n-GaN layer 7 may be directly in contact, and the gate electrode 21g may form the schottky junction with the n-GaN layer 7. Further, a recess portion may also be formed at the n-GaN layer 7 at downward of the gate electrode 21g. Namely, a gate recess structure may be taken. A depth of the recess portion as stated above may match with the thickness of the n-GaN layer 7, or the depth may either be shallower or deeper than the thickness of the n-GaN layer 7. It should be noted that it is preferable to perform the etching evenly. When the gate recess structure is taken, it is suitable for a high-speed operation because a response becomes high-speed. On the other hand, when the gate recess structure is not taken, the leak current can be suppressed more certainly. Accordingly, an adoption of the gate recess structure may be selected depending on uses thereof.

An insulating film may exist between the recess electrode 21r and the n-GaN layer 7. Namely, it may be an MIS structure. For example, an SiN film, an SiO$_2$ film, an HfO film, an HfNO film, an Al$_2$O$_3$ film, a TaO film, and so on can be cited as the insulating film. A thickness of this insulating film is, for example, approximately 0.1 nm to 50 nm. There may be a case when the leak current increases conversely or reliability decreases because of a reason that the insulating film may be formed in island state and so on when the thickness of the insulating film is less than 0.1 nm. There may be a case when the appearance of the two-dimensional electron gas cannot be fully suppressed because a distance between the recess electrode 21r and the n-AlGaN layer 6 becomes too large when the thickness of the insulating film exceeds 50 nm.

It is also possible to suppress the appearance of the two-dimensional electron gas even when the recess electrode 21r is provided between the gate electrode 21g and the drain electrode 21d. It should be noted that there are a case when a withstand voltage is easy to become low because a high voltage is applied to the drain electrode 21d, and a case when it becomes difficult to suppress the appearance of the two-dimensional electron gas effectively, in the constitution as stated above. Accordingly, it is preferable that the recess electrode 21r is provided between the gate electrode 21g and the source electrode 21s.

A silicon carbide (SiC) substrate, a sapphire substrate, a silicon substrate, a GaN substrate, a GaAs substrate, and so on may be used as the substrate 1. The substrate 1 may either be conductive, semi-insulating, or insulating.

Third Embodiment

Figure 10:
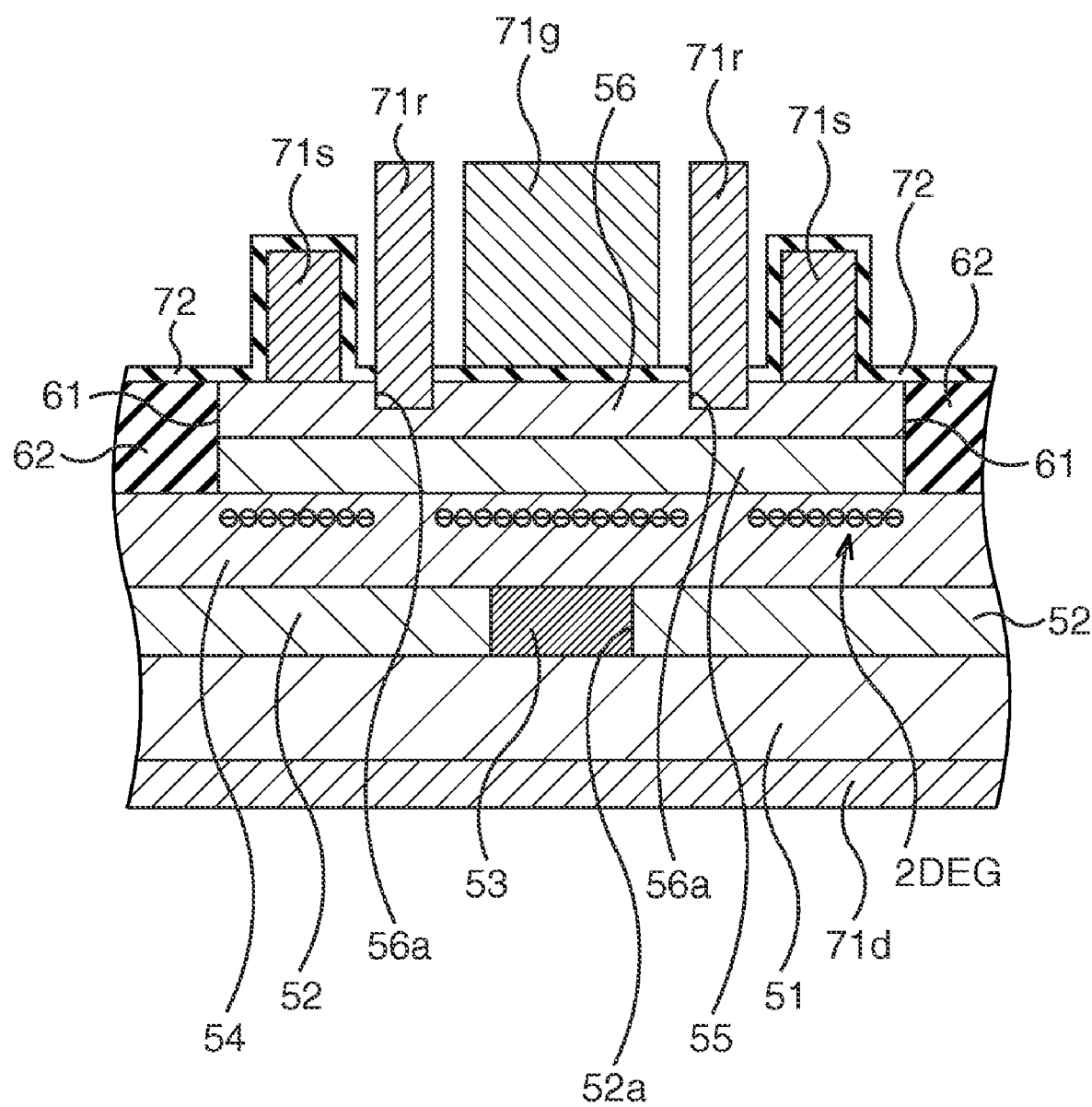
FIG. 10 is a sectional view illustrating a structure of a GaN based HEMT (compound semiconductor device) according to a third embodiment.

Next, a third embodiment is described. Structures of the GaN based HEMTs according to the first and second embodiments are horizontal structures, but a structure of a GaN based HEMT according to the third embodiment is a vertical structure. FIG. 10 is a sectional view illustrating a structure of the GaN based HEMT (compound semiconductor device) according to the third embodiment.

In the third embodiment, a non-doped i-AlN layer 52 having an opening 52a is formed on an n-type n-GaN layer 51. A thickness of the n-GaN layer 51 is approximately 0.1 μm to 100 μm (for example, 25 μm), and a thickness of the i-AlN layer 52 is approximately 0.02 μm to 20 μm. A planer shape of the opening 52a as a current passing area is, for example, a rectangle of which lengths in horizontal and vertical are respectively 0.5 μm and 500 μm. Fe, which is a transition metal element, is contained in the n-GaN layer 51 as an impurity. A content ratio of Fe is approximately $1\times10^{17}$ cm$^{-3}$ to $5\times10^{19}$ cm$^{-3}$. A GaN film 53 is formed in the opening 52a.

Further, a non-doped i-GaN layer 54, an n-type n-AlGaN layer 55, and an n-type n-GaN layer 56 are formed on the i-AlN layer 52 and the GaN layer 53. A thickness of the i-GaN layer 54 is approximately 1 μm to 2 μm. A thickness of the n-AlGaN layer 55 is approximately 20 nm to 30 nm. A thickness of the n-GaN layer 56 is approximately 3 nm to 8 nm. For example, Si is contained in the n-AlGaN layer 55 and the n-GaN layer 56 as an impurity with a concentration of approximately $1\times10^{17}$ cm$^{-3}$ to $5\times10^{19}$ cm$^{-3}$.

A trench 61 for element isolation are formed in the n-AlGaN layer 55 and the n-GaN layer 56, and element isolation insulating film 62 is embedded in the trench 61. A source electrode 71s of which planer shape is square is formed on the n-GaN layer 56. The source electrode 71s may be constituted by, for example, a Ta film and an Al film formed thereon, and the source electrode 71s forms the ohmic junction with the n-GaN layer 56.

Further, an SiN film 72 covering the n-GaN layer 56 and the source electrode 71s is formed, and a gate electrode 71g is formed on the SiN film 72 at an area surrounded by the source electrode 71s. A thickness of the SiN film 72 is approximately 1 nm to 2000 nm. Besides, an opening is formed in the SiN film 72 between the source electrode 71s and the gate electrode 71g, and a recess portion 56a is formed at a portion exposing from the opening of the n-GaN layer 56. A recess electrode 71r extending upward from the recess portion 56a is formed. The gate electrode 71g and the recess electrode 71r may be constituted by, for example, an Ni film and an Au film formed thereon, and the recess electrode 71r forms the schottky junction with the n-GaN layer 56.

Besides, the source electrode 71s and the recess electrode 71r are grounded.

Further, a drain electrode 71d is formed at a rear surface of the n-GaN layer 51. The drain electrode 71d may be constituted by, for example, a Ta film and an Al film formed thereon, and the drain electrode 71*d* forms the ohmic junction with the n-GaN layer 51.

As stated above, a piece of GaN based HEMT is constituted. Further, the GaN based HEMTs as stated above are provided so as to be arranged in one direction via the element isolation insulating film 62 as illustrated in FIG. 11. A region surrounded by the element isolation insulating film 62 is an element region 60. The GaN based HEMTs may be provided so as to be arranged in two directions via the element isolation insulating film 62.

In the third embodiment as stated above, the n-AlGaN layer 55 functions as an electron supplying layer supplying electrons to the i-GaN layer 54 (electron transit layer). A band gap of the n-AlGaN layer 55 is wide, and therefore, a deep potential well is formed in the i-GaN layer 54 at a region in the vicinity of an interface with the n-AlGaN layer 55, and two-dimensional electron gas (2DEG) appears there. Besides, the i-AlN layer 52 functions as an insulating layer insulating between a compound semiconductor layer including the i-GaN layer 54, and the n-GaN layer 51 and the drain electrode 71*d*. Incidentally, it is desirable that a thickness of the i-GaN layer 54 is 0.5 μm or more so that the two-dimensional electron gas inside the i-GaN layer 54 is difficult to be affected by Fe added to the n-GaN layer 51.

As stated above, the two-dimensional electron gas appears at a surface layer portion of the i-GaN layer 54, but in the present embodiment, the recess electrode 71*r* which forms the schottky junction with the n-GaN layer 56 is provided in the recess portion 56*a*, and the recess electrode 71*r* is grounded. Accordingly, the two-dimensional electron gas does not exist at the surface layer portion of the i-GaN layer 54 at downward of the recess electrode 71*r* resulting from the same reason as the first embodiment. Consequently, a leak current does not flow between the source electrode 71*s* and the drain electrode 71*d* under a state in which the voltage is not applied to the gate electrode 71*g* and an electric field seldom exists between the gate electrode 71*g* and the source electrode 71*s*. Namely, the normally-off operation is enabled. Besides, the current does not flow if the voltage higher than the conventional one is not applied to the gate electrode 71*g*, because the two-dimensional electron gas does not exist at the surface layer portion of the i-GaN layer 54 at downward of the recess electrode 71*r*. Namely, the threshold voltage increases resulting from the same reason as the first embodiment.

According to the third embodiment, it is possible to obtain the high threshold voltage, and to reduce the leak current when the gate voltage is "0" (zero) V, in addition that the normally-off operation is enabled also in the vertical structure.

Figure 12A:
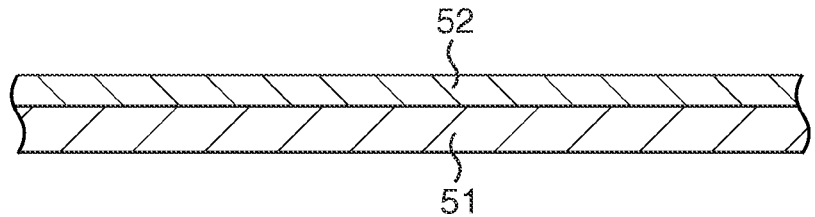
FIG. 12A to FIG. 12N are sectional views illustrating a manufacturing method of the GaN based HEMT according to the third embodiment in process sequence.

Next, a manufacturing method of the GaN based HEMT (compound semiconductor device) according to the third embodiment is described. FIG. 12A to FIG. 12N are sectional views illustrating the manufacturing method of the GaN based HEMT (compound semiconductor device) according to the third embodiment in process sequence.

At first, the i-AlN layer 52 is formed on the n-GaN layer 51 by an HVPE method, as illustrated in FIG. 12A.

Figure 12B:
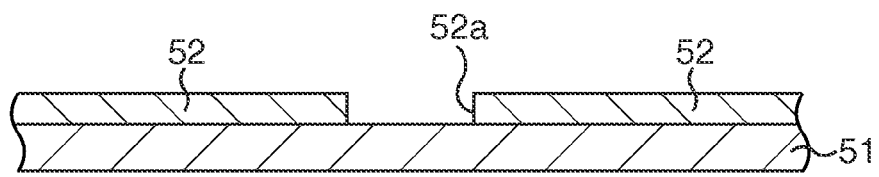

Next, the opening 52*a* is formed at the i-AlN layer 52, as illustrated in FIG. 12B. As for the formation of the opening 52*a*, for example, a resist pattern exposing an area to form the opening 52*a* is formed on the i-AlN layer 52, and the i-AlN layer 52 is etched by using this resist pattern as a mask. After that, the resist pattern is removed.

Figure 12C:
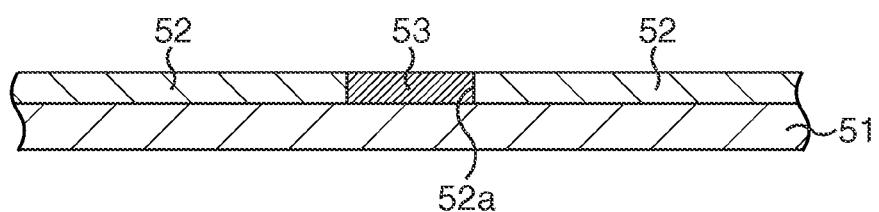

After that, the GaN layer 53 is formed in the opening 52*a* by, for example, an MOCVD method, as illustrated in FIG. 12C.

Figure 12D:
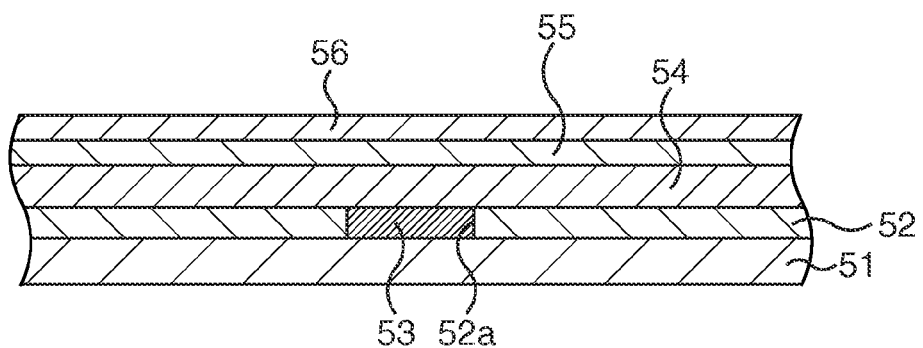

Subsequently, the i-GaN layer 54, the n-AlGaN layer 55, and the n-GaN layer 56 are formed in this sequence on the i-AlN layer 52 and the GaN layer 53 by, for example, an MOCVD method, as illustrated in FIG. 12D.

Figure 12E:
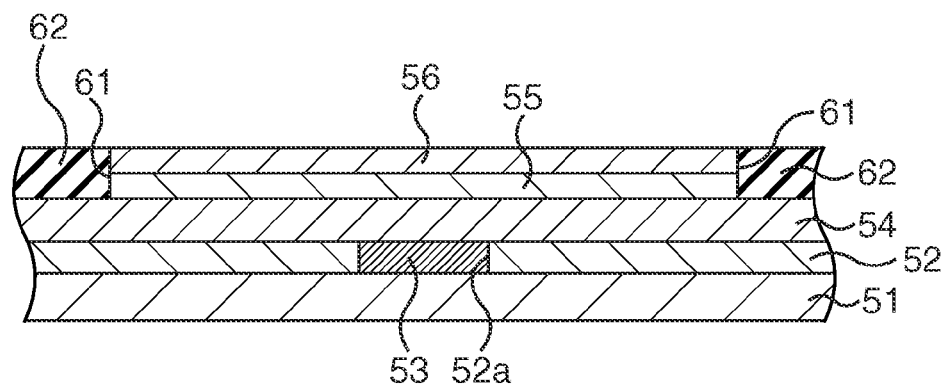

Next, the trench 61 penetrating the n-GaN layer 56 and the n-AlGaN layer 55 and reaching the i-GaN layer 54 is formed by a photolithography and an etching, as illustrated in FIG. 12E. After that, the element isolation insulating film 62 is embedded inside the trench 61 by, for example, a plasma CVD method. Incidentally, an element isolation region may be formed by an ion implantation such as Ar, instead of the formation of the trench 61 and the element isolation insulating film 62.

Figure 12F:
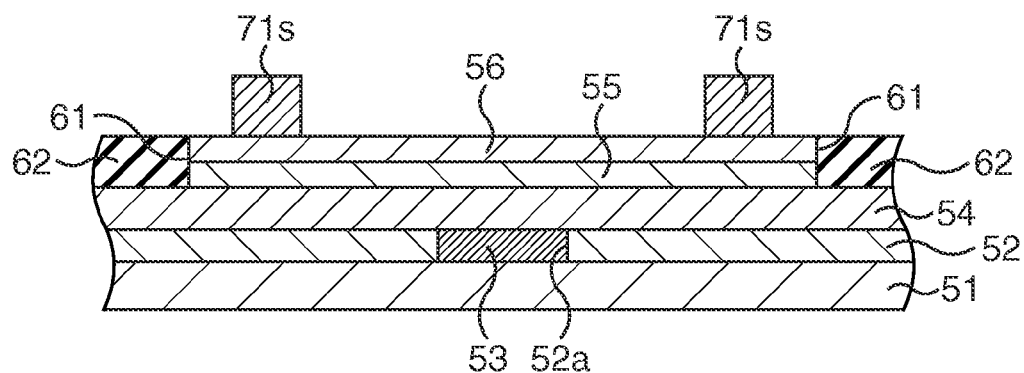

The source electrode 71*s* is then formed on the n-GaN layer 56 by a lift-off method, as illustrated in FIG. 12F. In the formation of the source electrode 71*s*, a new resist pattern opening an area to form the source electrode 71*s* is formed, vapor depositions of Ta and Al are performed, and thereafter, Ta and Al adhered on the resist pattern are removed together with the resist pattern. Thicknesses of a Ta film, an Al film are set to be, for example, respectively approximately 20 nm, 200 nm. The heat treatment is performed from 400° C. to 1000° C., for example, at 600° C. in a nitride atmosphere to establish the ohmic characteristics.

Figure 12G:
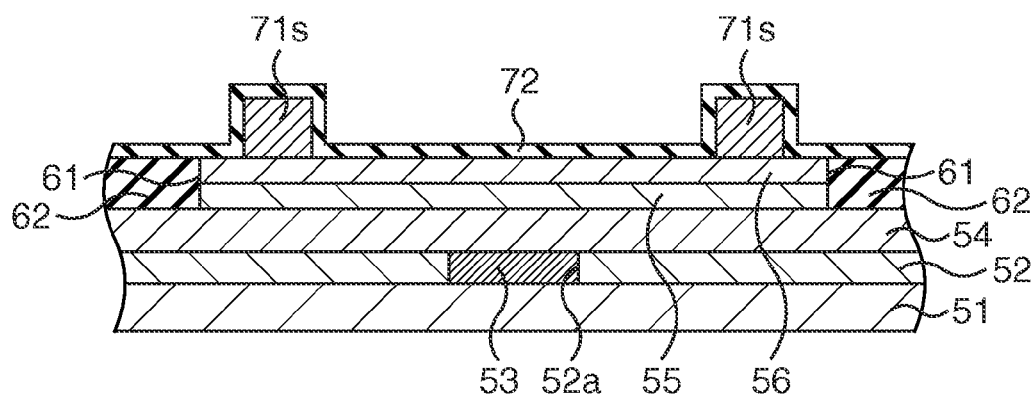

Next, the SiN film 72 is formed on a whole surface by, for example, a plasma CVD method, as illustrated in FIG. 12G.

Figure 12H:
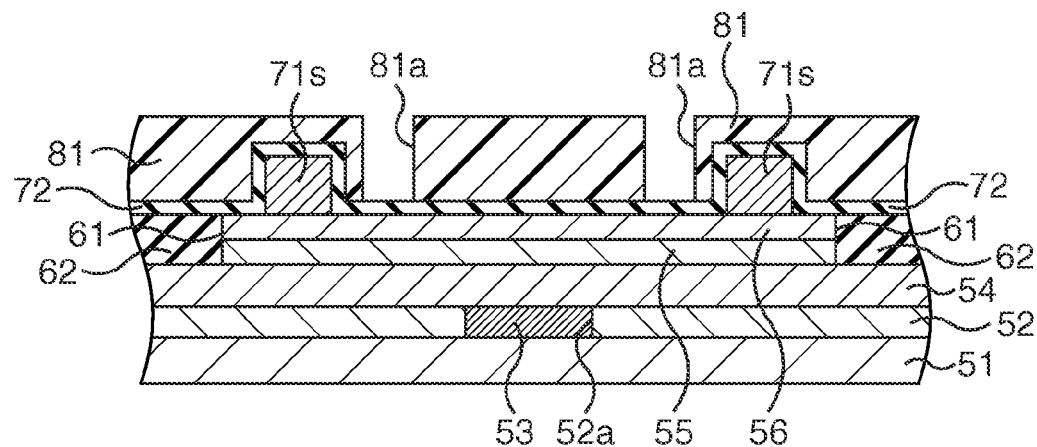

After that, a resist pattern 81 having an opening 81*a* corresponding to an area to form the recess portion 56*a* and covering the other area is formed on the SiN film 72, as illustrated in FIG. 12H.

Figure 12I:
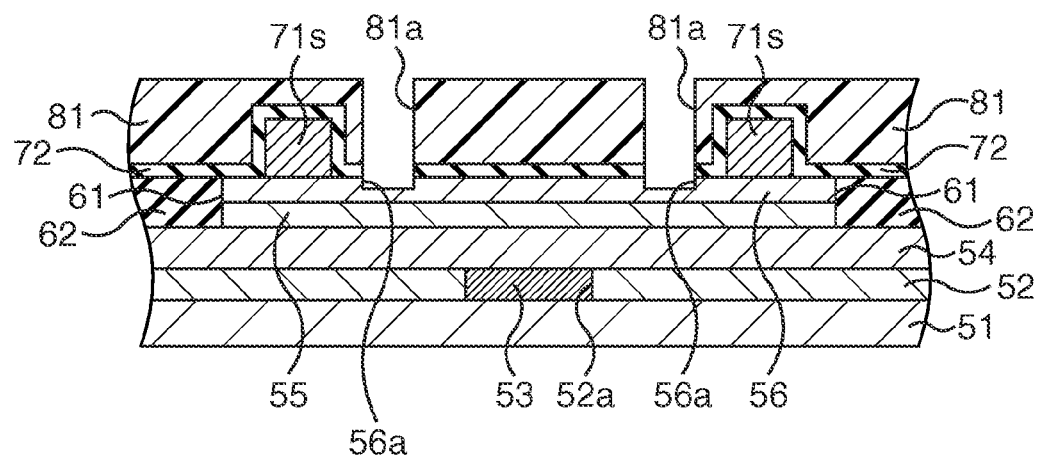

Subsequently, an opening is formed in the SiN film 72 by etching the SiN film 72 with using the resist pattern 81 as a mask, as illustrated in FIG. 12I, and the recess portion 56*a* is formed by etching the surface layer portion of the n-GaN layer 56. A remaining thickness of a portion where the recess portion 56*a* is formed of the n-GaN layer 56 is preferable to be 10 nm or less, and it is set to be, for example, approximately 5 nm to 10 nm. The resist pattern 81 is then removed.

Figure 12J:
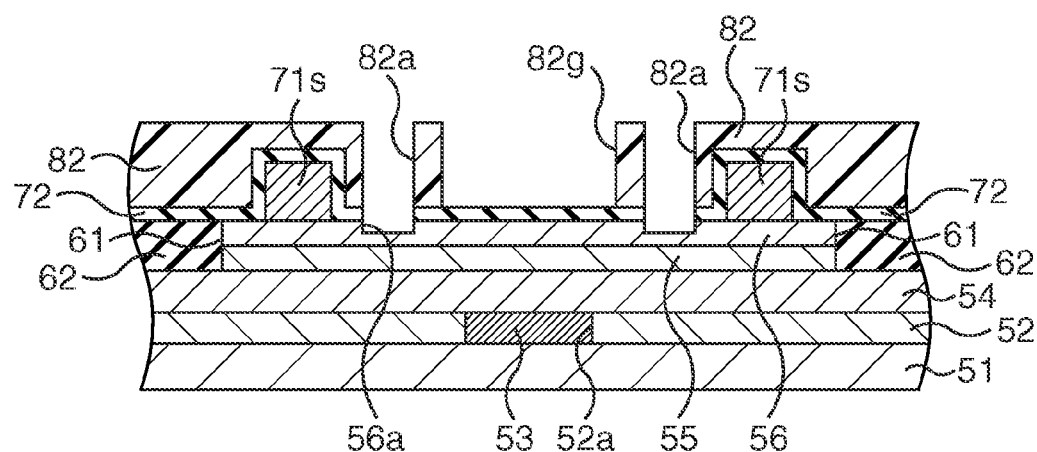

Next, a resist pattern 82 having an opening 82*g* corresponding to an area to form the gate electrode 71*g* and an opening 82*a* exposing the recess portion 56*a* and covering the other area is formed on the SiN film 72, as illustrated in FIG. 12J.

Figure 12K:
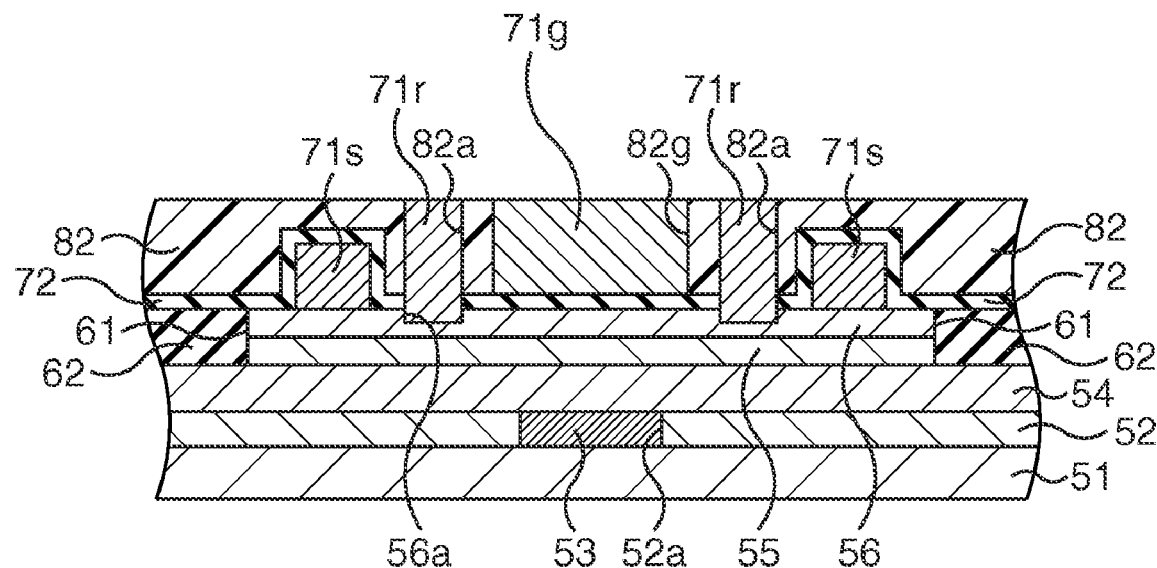

After that, the gate electrode 71*g* and the recess electrode 71*r* are formed by performing vapor depositions of Ni and Au, as illustrated in FIG. 12K. Thicknesses of an Ni film and an Au film are, for example, respectively approximately 10 nm and 300 nm.

Figure 12L:
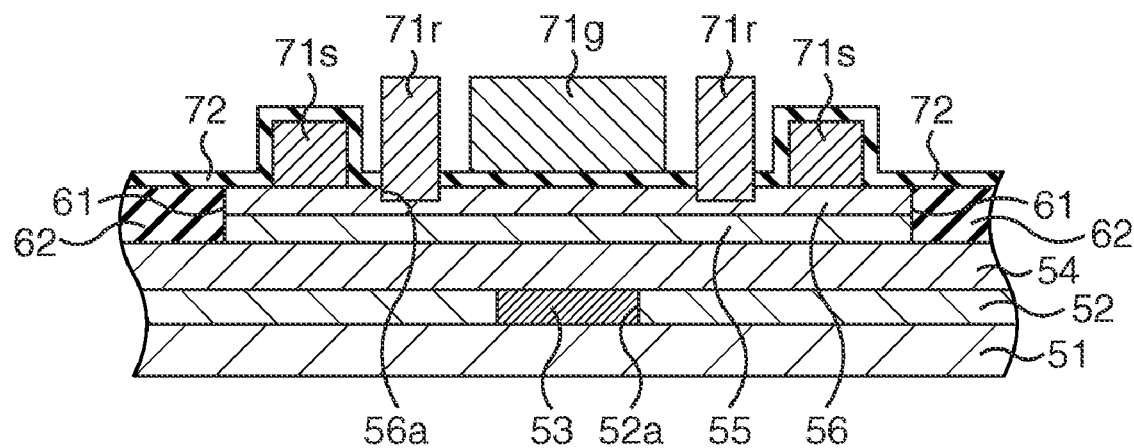

Subsequently, Ni and Au adhered on the resist pattern 82 are removed together with the resist pattern 82, as illustrated in FIG. 12L. As stated above, the gate electrode 71*g* and the recess electrode 71*r* can be formed by a lift-off method.

Figure 12M:
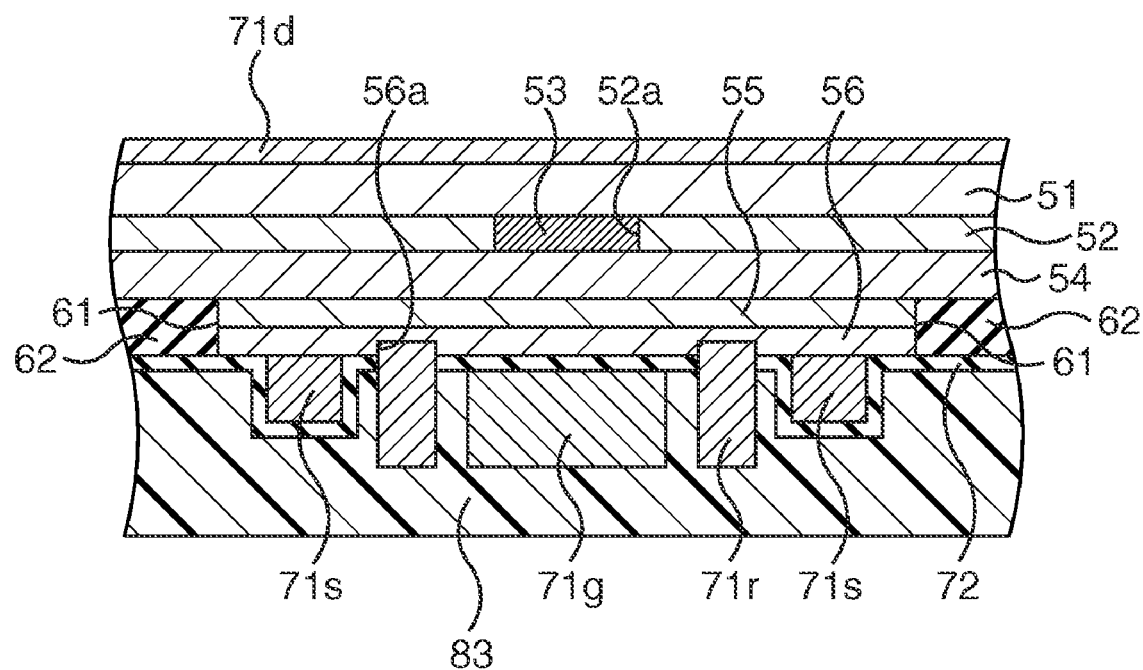
Figure 12N:
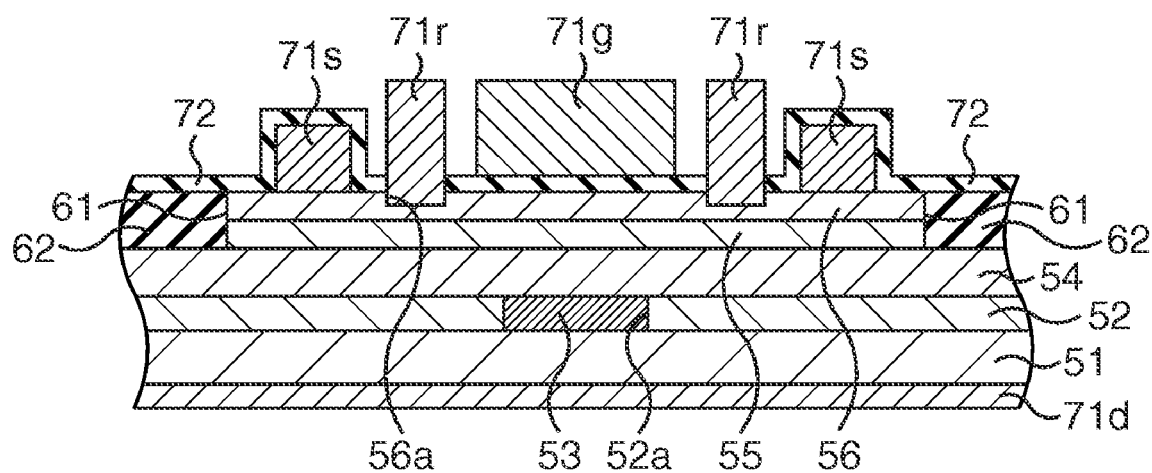

Next, a surface protecting layer 83 is formed on a whole surface at a front surface side of the n-GaN layer 51, as illustrated in FIG. 12M, and the front-and-rear of the n-GaN layer 51 are reversed. After that, the drain electrode 71*d* is formed on the whole surface of the rear surface of the n-GaN layer 51.

Subsequently, the front-and-rear of the n-GaN layer 51 are reversed as illustrated in FIG. 12N, and the surface protecting layer 83 is removed.

Next, wirings to ground the source electrode 71*s* and the recess electrode 71*r*, and so on are formed.

The GaN based HEMT according to the third embodiment is completed as stated above. After that, a semiconductor device in which the GaN based HEMTs are integrated is completed by forming the passivation film, external electrodes, and so on if necessary.

Incidentally, an n-type conductive GaN substrate may be used as the n-GaN layer 51 in the third embodiment. Besides, the n-GaN layer 51 may be formed on a conductive substrate.

Besides, the opening for the source electrode is formed only in the n-GaN layer 56, and the source electrode 71s may be formed in the opening. A part of the n-GaN layer 56 may remain or a part of the n-AlGaN layer 55 may be removed, as for a depth of the opening. Namely, the depth of the opening is not necessarily match with the thickness of the n-GaN layer 56.

Besides, the gate electrode 71g and the n-GaN layer 56 may be directly in contact, and the gate electrode 71g may form the schottky junction with the n-GaN layer 56. Further, a recess portion may be formed at the n-GaN layer 56 also at downward of the gate electrode 71g. Namely, the gate recess structure may be taken. A depth of the recess portion as stated above may match with the thickness of the n-GaN layer 56, or the depth may be shallower than the thickness of the n-GaN layer 56. It should be noted that it is preferable to perform the etching evenly. When the gate recess structure is taken, it is suitable for a high-speed operation because a response becomes high-speed. On the other hand, when the gate recess structure is not taken, the leak current can be suppressed more certainly. Accordingly, the adoption of the gate recess structure may be selected depending on uses thereof.

Incidentally, the structures of the gate electrode, the source electrode, the drain electrode and the recess electrode are not limited to the ones in the above-stated embodiments. For example, these electrodes may be constituted by a single layer. Besides, the formation method thereof is not limited to the lift-off method. Further, the heat treatment after the formations of the source electrode and the drain electrode may not be performed as long as the ohmic characteristics can be obtained. The heat treatment may be performed for the gate electrode and the recess electrode. Any one kind or a combination of two kinds or more from among gold, nickel, platinum, copper, tungsten nitride, titanium nitride, palladium, cobalt, rhodium, rhenium, and iridium can be cited as materials of the gate electrode and the recess electrode.

The thickness, the material, and so on of each layer are not limited to the ones in the above-stated embodiments. Besides, the recess electrode is not necessarily connected to the source electrode, and also, it is not necessary to be grounded as long as the electric potential different from the gate electrode is supplied thereto.

It is preferable that an insulating film of which relative dielectric constant is three or less is provided between the source electrode and the gate electrode. For example, a porous SiOH film, a carbon fluoride film, an organic silica film, and so on can be cited as the insulating film as stated above.

According to the above-stated compound semiconductor device and so on, it is possible to reduce the leak current at the power-off time because the appearance of the two-dimensional electron gas can be suppressed locally resulting from an influence of the schottky electrode.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A compound semiconductor device, comprising:
   an electron transit layer;
   a compound semiconductor layer formed over the electron transit layer;
   a source electrode and a drain electrode formed over the compound semiconductor layer,
   an insulating film formed between the source electrode and the drain electrode and over the compound semiconductor layer;
   a gate electrode formed over the insulating film; and
   a schottky electrode,
   wherein a recess portion is formed inside an area between the source electrode and the drain electrode of the compound semiconductor layer and the insulating film, and at a portion separating from the gate electrode, and
   wherein the schottky electrode is formed in the recess portion.

2. The compound semiconductor device according to claim 1, wherein the recess portion is formed inside an area between the source electrode and the gate electrode.

3. The compound semiconductor device according to claim 1, wherein the schottky electrode is grounded.

4. The compound semiconductor device according to claim 1, wherein the schottky electrode is connected to the source electrode.

5. The compound semiconductor device according to claim 1, wherein an electric potential different from the gate electrode is supplied to the schottky electrode.

6. The compound semiconductor device according to claim 1, further comprising an electron supply layer formed between the electron transit layer and the compound semiconductor layer.

7. The compound semiconductor device according to claim 1, further comprising an insulating film formed along an inner surface of the recess portion.

8. The compound semiconductor device according to claim 1, wherein a thickness of a portion of the compound semiconductor layer where the recess portion is formed is 10 nm or less.

9. A manufacturing method of a compound semiconductor device, comprising:
   forming a compound semiconductor layer over an electron transit layer;
   forming a source electrode and a drain electrode over the compound semiconductor layer;
   forming an insulating film between the source electrode and the drain electrode and over the compound semiconductor layer;
   forming a gate electrode over the insulating film;
   forming a recess portion inside an area between the source electrode and the drain electrode of the compound semiconductor layer and the insulating film, and at a portion separating from the gate electrode; and
   forming a schottky electrode in the recess portion.

* * * * *